United States Patent
Dudeck et al.

(10) Patent No.: US 7,898,887 B2
(45) Date of Patent: Mar. 1, 2011

(54) SENSE AMPLIFIER WITH REDUNDANCY

(75) Inventors: Dennis E. Dudeck, Hazleton, PA (US);
Donald Albert Evans, Lancaster, OH (US); Hai Quang Pham, Hatfield, PA (US); Wayne E. Werner, Coopersburg, PA (US); Ronald James Wozniak, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 285 days.

(21) Appl. No.: 12/160,538

(22) PCT Filed: Aug. 29, 2007

(86) PCT No.: PCT/US2007/077083

§ 371 (c)(1),
(2), (4) Date: Jul. 10, 2008

(87) PCT Pub. No.: WO2009/029097

PCT Pub. Date: Mar. 5, 2009

(65) Prior Publication Data

US 2010/0157707 A1    Jun. 24, 2010

(51) Int. Cl.
*G11C 7/02* (2006.01)
(52) U.S. Cl. .................. 365/207; 365/154; 365/189.02; 365/189.15; 365/189.08; 365/196; 365/202; 365/205; 365/206; 365/230.02

(58) Field of Classification Search .................. 365/207, 365/154, 189.02, 189.15, 189.05, 189.08, 365/190, 196, 202, 205, 206, 230.02
See application file for complete search history.

(56) References Cited

U.S. PATENT DOCUMENTS

| 5,455,798 | A | 10/1995 | McClure | |
|---|---|---|---|---|
| 5,942,942 | A | 8/1999 | Wang | |
| 7,302,029 | B2 * | 11/2007 | Lee et al. | 377/94 |
| 7,479,831 | B2 * | 1/2009 | Malone | 330/257 |
| 2003/0057520 | A1 * | 3/2003 | Kawasumi | 257/553 |
| 2006/0152970 | A1 * | 7/2006 | DeBrosse et al. | 365/171 |

FOREIGN PATENT DOCUMENTS

WO  PCT/US2007/077083      7/2008

* cited by examiner

*Primary Examiner*—Hoai V Ho
*Assistant Examiner*—Fernando N Hidalgo
(74) *Attorney, Agent, or Firm*—Ryan, Mason & Lewis, LLP

(57) ABSTRACT

A sense amplifier includes a first sensing element and a second sensing element redundant to the first sensing element. The sense amplifier further comprises a switch circuit configured to switch between the first and second sensing elements when an offset of the sense amplifier is greater than a prescribed amount.

20 Claims, 3 Drawing Sheets

SENSE AMPLIFIER WITH REDUNDANCY

FIELD OF THE INVENTION

The present invention relates generally to electronic circuits, and more particularly relates to sense amplifier circuits.

BACKGROUND OF THE INVENTION

Memory arrays, such as, for example, random access memory (RAM), generally include multiple memory cells, with each memory cell storing a voltage indicative of a logic state (e.g., "0" or "1") of the cell. Sense amplifiers are used in memory arrays for sensing the output voltage of selected memory cells to thereby read the respective logic states of the cells.

With advancements in technology, memory cells are continually shrinking in size. Unfortunately, the reduction in the size of the memory cell is accompanied by reduction in the sensed voltage from the memory cell. Moreover, as technologies continue to shrink, localized mismatches between transistor devices in the sense amplifier are becoming more significant, thus resulting in increased offset voltage in the sense amplifier. The offset voltage due to local threshold voltage and current mismatches between devices in the sense amplifier, in combination with reduced voltage differential between stored logic states in the memory cell, reduces the resolution during a read operation and underscores the importance of reducing DC offset in the sense amplifier.

U.S. Pat. No. 5,455,798 to McClure discloses arranging a memory array into blocks having redundant columns, each of which can replace a column in any one of the blocks. A plurality of redundant sense amplifiers are included, each associated with selected redundant columns. The redundant sense amplifiers are controlled by redundant column decoders. The coupling of each redundant sense amplifier is controlled by a redundant multiplexer associated with each of the input/output terminals. However, while this approach allows a sense amplifier to be replaced if a defect is found, the level of redundancy required significantly increases the size of the memory array and is therefore undesirable.

Accordingly, there exists a need for an improved sense amplifier which does not suffer from one or more of the above-noted problems exhibited by conventional sense amplifiers.

SUMMARY OF THE INVENTION

The present invention meets the above-noted need by providing, in illustrative embodiments thereof, a sense amplifier which includes a redundant element therein. When it is determined that an offset of the sense amplifier is greater than a prescribed amount to provide reliable operation, the redundant element is switched into operation. By replacing only a portion of the sense amplifier with the redundant element, techniques in accordance with embodiments of the invention advantageously provide sense amplifier redundancy without adding new columns or entire new sense amplifiers, and therefore reduce the amount of semiconductor area required.

In accordance with an embodiment of the invention, a sense amplifier includes a first sensing element and a second sensing element redundant to the first sensing element. The sense amplifier further comprises a switch circuit configured to switch between the first and second sensing elements when an offset of the sense amplifier is greater than a prescribed amount.

In accordance with another aspect of the invention, a sense amplifier includes first and second differential input stages, respectively, selectively connectable to differential input/output nodes and being adapted to receive a differential signal presented to the differential input/output nodes. The second differential input stage is substantially matched and redundant to the first differential input stage. The sense amplifier may further include a load stage operatively connected between a voltage supply of the sense amplifier and at least one of the first and second differential input stages. The load stage is operative to bias at least one of the first and second differential input stages at a prescribed operating point. A control circuit is connected to the first and second differential input stages, the control circuit being operative to selectively enable one of the first and second differential input stages as a function of at least one control signal supplied to the control circuit.

According to yet another embodiment of the invention, an electronic system includes a memory array including a plurality of memory cells, and at least one sense amplifier connected to the memory array for selectively reading a logic state of at least one of the memory cells in the memory array. The sense amplifier includes first and second sensing elements, the second sensing element being redundant to the first sensing element. The sense amplifier further comprises a switch circuit for switching between the first and second sensing elements when an offset of the sense amplifier is greater than a prescribed amount.

In accordance with another aspect of the invention, a method of reducing offset in a sense amplifier includes the steps of: providing a first sensing element in the sense amplifier; providing a second sensing element in the sense amplifier, the second sensing element being redundant to the first sensing element; determining an offset of the sense amplifier; and switching between the first and second sensing elements when an offset of the sense amplifier is greater than a prescribed amount.

These and other objects, features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative sense amplifier circuits for use, for example, in a memory array including a plurality of memory cells and a plurality of bit lines coupled to the memory cells for selectively accessing the memory cells. It should be understood, however, that the present invention is not limited to these or any other particular circuit arrangements. Rather, the invention is more generally applicable to techniques for beneficially reducing offset in a sense amplifier without significantly impacting performance and/or significantly increasing a size of the sense amplifier.

Although implementations of the present invention described herein may be implemented using p-channel metal-oxide-semiconductor (PMOS) and n-channel metal-oxide-semiconductor (NMOS) transistor devices, as may be formed using a complementary metal-oxide-semiconductor (CMOS) fabrication process, it is to be appreciated that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be understood by those skilled in the art. Moreover, although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

Figure 1:
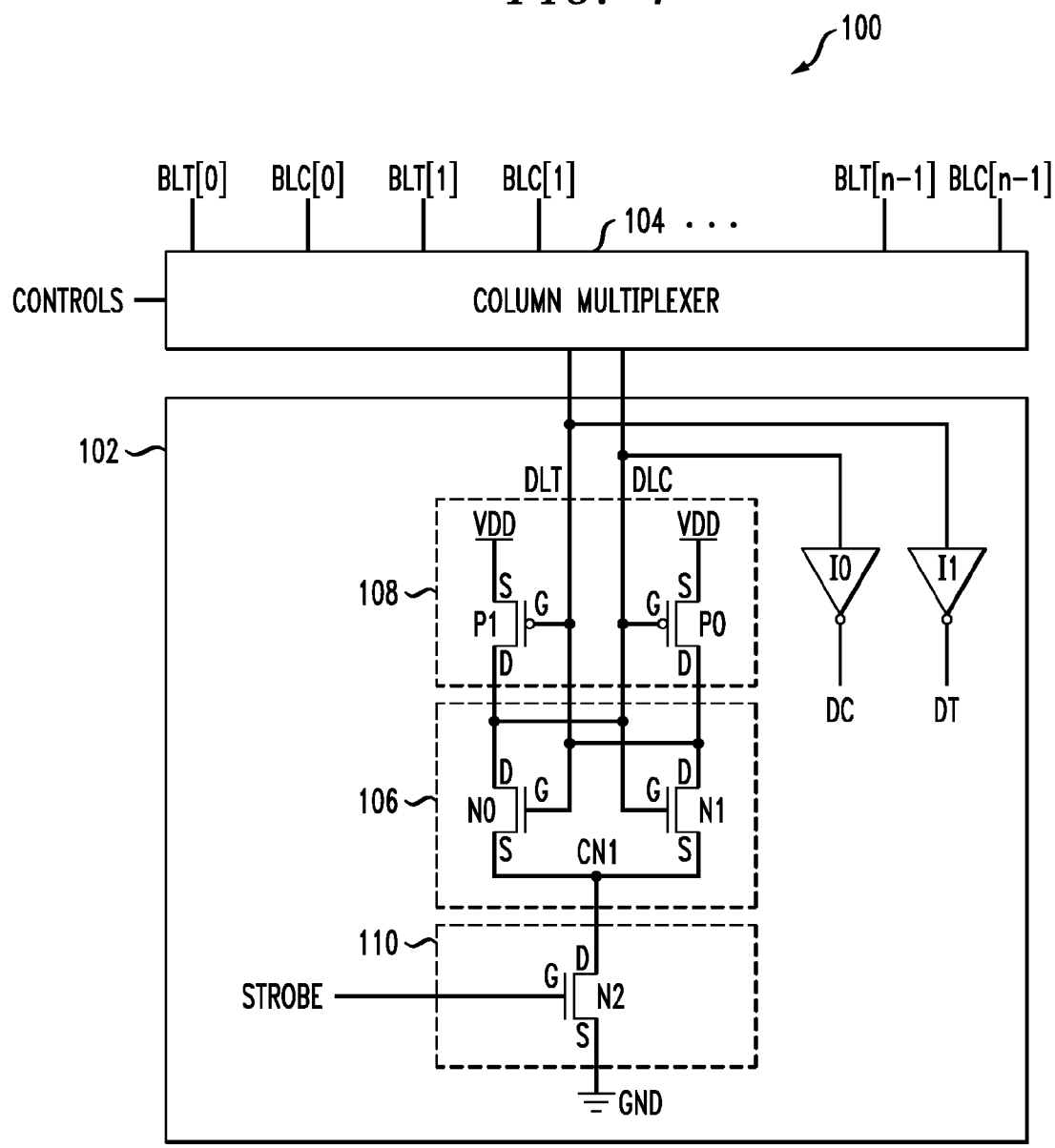
FIG. 1 is a schematic diagram depicting at least a portion of an exemplary memory circuit which can be modified to implement techniques of the present invention.

FIG. 1 is a schematic diagram depicting at least a portion of an exemplary memory circuit 100. Memory circuit 100 includes a sense amplifier 102 and a column multiplexer 104 connected to the sense amplifier. The column multiplexer 104 is connected to a plurality of pairs of complementary bit lines, BLT[0] and BLC[0], BLT[1] and BLC[1], and BLT[n−1] and BLC[n−1], where n is an integer greater than one. "BLT" designates a true bit line and "BLC" designates a complement bit line for a given pair of complementary bit lines. As the name suggests, a signal conveyed by a complement bit line BLC will be a logical complement of a signal conveyed by a corresponding true bit line BLT. The pairs of bit lines are connected to memory cells (not shown) in the memory circuit 100 and serve to convey data from or to the memory cells during a read or write operation, respectively. Column multiplexer 104 functions, at least in part, to connect a selected pair of complementary bit lines to sense amplifier 102, via true and complement data lines, DLT and DLC, respectively, as a function of one or more control signals, CONTROLS, provided to the multiplexer. For economy of description, only a portion of a single column in memory circuit 100 is shown, although a typical memory array may comprise a plurality of such columns.

Sense amplifier 102 includes a differential input stage 106 which is connected to a voltage supply of the sense amplifier, such as, for example VDD, via a load stage 108. Input stage 106 is connected to the true and complement data lines DLT and DLC, respectively, of memory circuit 100. Input stage 106 preferably comprises a pair of NMOS transistor devices, N0 and N1, connected together in a cross-coupled arrangement. More particularly, a drain (D) of device N0 and a gate (G) of device N1 are connected to complement data line DLC, a source (S) of N0 is connected to a source of N1 at node CN1, and a gate of N0 and a drain of N1 are connected to true data line DLT. The cross-coupled arrangement of devices N0 and N1 enables input stage 106 to latch data read from a selected memory cell in memory circuit 100 and conveyed on lines DLT and DLC. As in the case of the bit lines, data conveyed by complement data line DLC will be a logical complement of data conveyed by true data line DLT.

It is to be appreciated that, because a metal-oxide-semiconductor (MOS) device is symmetrical in nature, and thus bidirectional, the assignment of source and drain designations in the MOS device is essentially arbitrary. Therefore, the source and drain may be referred to herein generally as first and second source/drain, respectively, where "source/drain" in this context denotes a source or a drain.

Node CN1, which forms a virtual ground of input stage 106, may be connected to a voltage return of the sense amplifier 102, which may be ground, either directly or via a switch circuit 110, or alternative control circuitry. As shown, switch circuit 110 may be implemented using an NMOS device N2 having a source connecting to ground, a drain connected to the input stage 106 at node CN1, and a gate adapted to receive a control signal, STROBE, which may be a data strobe signal, for selectively activating the sense amplifier. For example, when control signal STROBE is a logic high level (e.g., "1"; VDD), device N2 will be turned on, thereby connecting input stage 106 to ground. When STROBE is a logic low level (e.g., "0": zero volts), device N2 will be turned off, disconnecting input stage 106 from ground and thereby disabling sense amplifier 102.

Load stage 108 preferably includes a pair of PMOS transistor devices, P0 and P1, connected in a cross-coupled arrangement between the input stage 106 and the voltage supply VDD. More particularly, sources of devices P0 and P1 connect to VDD, a drain of P0 is connected to the drain of N1, a drain of P1 is connected to the drain of N0, a gate of P0 is connected to the gate of N0, and a gate of P1 is connected to the gate of N1. The combination of input stage 106 and load stage 108 essentially forms a pair of cross-coupled inverters, with a first inverter comprising devices P1 and N0 and a second inverter comprising devices P0 and N1. This common latch configuration is often utilized as a storage element in static RAM (SRAM).

In order to buffer the differential signal read from the selected memory cell and latched on the true and complement data lines DLT and DLC, respectively, a pair of buffers, I0 and I1, may be employed. Specifically, an input of buffer I0 is connected to complement data line DLC and an output of I0 forms a complement data output, DC, of sense amplifier 102. Likewise, an input of buffer I1 is connected to true data line DLT and an output of I1 forms a true data output, DT, of sense amplifier 102. It is to be understood that, although inverting buffers are depicted in sense amplifier 102, non-inverting buffers may alternatively be employed.

As semiconductor fabrication technologies advance, memory cell dimensions typically shrink and voltages within the memory cell are scaled down proportionately in order to reduce peak electric fields within the cell that could otherwise damage the cell. Accordingly, the difference in output voltages of the memory cell between the two states indicative of the binary data stored in the cell are reduced. For instance, using certain integrated circuit (IC) process technologies, there may be less than about 70 millivolts difference between the output voltages indicative of logic "1" and logic "0" states in the memory cell. Unfortunately, in addition to having to detect a smaller difference signal, the reduction in IC dimensions results in increased localized mismatches in the sense amplifier, thereby increasing direct current (DC) offset in the sense amplifier. The increased DC offset, which can approach about 30 millivolts, depending upon variations in process, voltage and/or temperature (PVT) conditions to which the sense amplifier may be subjected, further reduces resolution and noise margin in the sense amplifier.

A primary source of offset in the sense amplifier can be attributed to mismatches between the devices forming the input stage of the sense amplifier. One method for reducing mismatch in the input stage 106 is to make the sizes of the matched devices N0 and N1 substantially large, so that any mismatches in the respective device dimensions resulting from local IC process anomalies become less influential. This approach, however, significantly increases the size of the sense amplifier and is therefore undesirable.

Figure 2A:
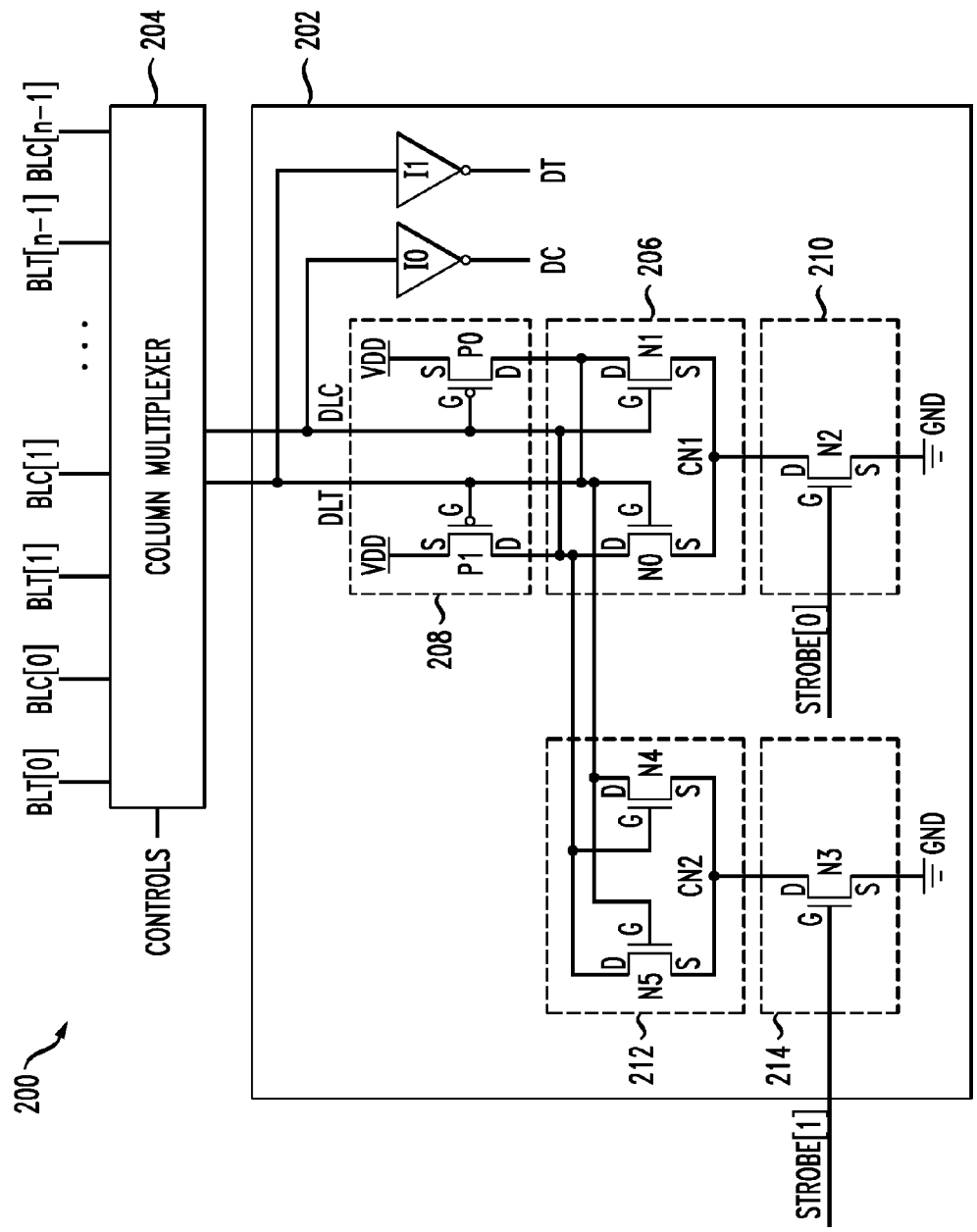
FIG. 2A is a schematic diagram depicting at least a portion of an exemplary memory circuit, formed in accordance with an embodiment of the present invention.

FIG. 2A is a schematic diagram depicting at least a portion of an exemplary memory circuit 200, formed in accordance with an embodiment of the present invention. Like memory circuit 100 shown in FIG. 1, memory circuit 200 preferably includes a sense amplifier 202 and a column multiplexer 204, or alternative switching circuit, connected to the sense amplifier. The column multiplexer 204 is connected to a plurality of pairs of complementary bit lines, BLT[0] and BLC[0], BLT[1] and BLC[1], and BLT[n−1] and BLC[n−1], where n is an integer greater than one. The bit lines are connected to memory cells (not shown) in the memory circuit 200 and serve to convey data from or to the memory cells during a read or write operation, respectively. Column multiplexer 204 functions, at least in part, to connect a selected pair of complementary bit lines to sense amplifier 202, via true and complement data lines, DLT and DLC, respectively, as a function of one or more control signals, CONTROLS, provided to the multiplexer. Data lines DLT and DLC may be referred to herein as differential input/output lines, and sense amplifier nodes connecting to these lines may be referred to as differential input/output nodes. It is to be appreciated that, for economy of description, only a portion of a single column in memory circuit 200 is shown, although a typical memory array may comprise a plurality of such columns.

Sense amplifier 202 includes a first differential input stage 206 which is connected to a voltage supply of the sense amplifier, such as, for example VDD, via a load stage 208. First differential input stage 206 is connected to the true and complement data lines DLT and DLC, respectively. First differential input stage 206 comprises a pair of matched NMOS transistor devices, N0 and N1, connected together in a cross-coupled arrangement, with a drain of device N0 and a gate of device N1 connected to complement data line DLC, a source of N0 connected to a source of N1 at node CN1, and a gate of N0 and a drain of N1 connected to true data line DLT. As previously stated, the cross-coupled arrangement of devices N0 and N1 enables first differential input stage 206 to latch data read from a selected memory cell in memory circuit 200 and conveyed on lines DLT and DLC.

Node CN1 may be connected to a voltage return of the sense amplifier 202, which may be ground, either directly or via a first switch circuit 210, or alternative control circuitry, to thereby enable first differential input stage 206. As shown, first switch circuit 210 may be implemented using an NMOS device N2 having a source connecting to ground, a drain connected to first differential input stage 206 at node CN1, and a gate adapted to receive a first control signal, STROBE [0], which may be a data strobe signal, for selectively activating the sense amplifier. For example, when signal STROBE [0] is a logic high level, device N2 will be turned on, thereby connecting first differential input stage 206 to ground. When STROBE[0] is a logic low level, device N2 will be turned off, disconnecting first differential input stage 206 from ground and thereby disabling at least the first differential input stage.

Load stage 208 preferably includes a pair of PMOS transistor devices, P0 and P1, connected in a cross-coupled arrangement between first differential input stage 206 and VDD. More particularly, sources of devices P0 and P1 connect to VDD, a drain of P0 is connected to the drain of device N1, a drain of P1 is connected to the drain of device N0, a gate of P0 is connected to the gate of N0, and a gate of P1 is connected to the gate of N1. Of course, load stage 208 is merely illustrative and the invention is not intended to be limited to the specific circuit configuration shown.

In a manner consistent with memory circuit 100 depicted in FIG. 1, a pair of buffers, I0 and I1, are included in sense amplifier 202 in order to buffer the differential signal read from the selected memory cell and latched on the true and complement data lines DLT and DLC, respectively. Specifically, an input of buffer I0 is connected to complement data line DLC and an output of I0 forms a complement data output, DC, of sense amplifier 202. Likewise, an input of buffer I1 is connected to true data line DLT and an output of I1 forms a true data output, DT, of sense amplifier 202. It is to be understood that, although inverting buffers are depicted in sense amplifier 202, non-inverting buffers may be similarly employed.

Sense amplifier 202 further includes a second differential input stage 212 connected in parallel with the first differential input stage 206. Specifically, second differential input stage 212 comprises a pair of NMOS devices, N4 and N5, connected together in a cross-coupled arrangement, with a drain of device N4 and a gate of device N5 connected to true data line DLT, a source of N4 connected to a source of N5 at node CN2, and a gate of N4 and a drain of N5 connected to complement data line DLC. Like devices N0 and N1 in first differential input stage 206, devices N4 and N5 are matched to one another so as to minimize offset. In this regard, the first and second differential input stages 206 and 212, respectively, are preferably substantially identical to one another.

A second switch circuit 214 operative to connect node CN2 to ground may be provided in sense amplifier 202 for selectively enabling second differential input stage 212. Second switch circuit 214 may be implemented using an NMOS device N3 having a source connecting to ground, a drain connected to second differential input stage 212 at node CN2, and a gate adapted to receive a second control signal, STROBE[1], which may be a data strobe signal. For example, when signal STROBE[1] is a logic high level, device N3 will be turned on, thereby connecting first differential input stage 206 to ground. When STROBE[1] is a logic low level, device N3 will be turned off, disconnecting second differential input stage 212 from ground and thereby disabling sense amplifier 202.

Second differential input stage 212 is a redundant stage in that it is ideally only used when the offset in sense amplifier 202 resulting from a mismatch in the first differential input stage 206 is greater than a prescribed amount. It is to be understood that first and second differential input stages 206 and 212, respectively, are preferably not enabled in sense amplifier 202 at the same time, and therefore only one of control signals STORBE[0] and STROBE[1] is active at any given time. For example, when STROBE[0] is a logic high level, STROBE[1] is a logic low level, and vice versa. First differential input stage 206 may be used as a default input stage and second differential input stage 212 may be used as the redundant input stage, although these designations are essentially arbitrary.

Figure 2B:
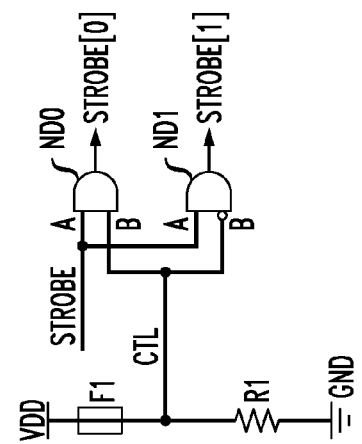
FIG. 2B is a schematic diagram depicting an exemplary control signal generator which may be utilized with the memory circuit of FIG. 2A, in accordance with an embodiment of the present invention.

Control signals STROBE[0] and STROBE[1] for selectively activating the first and second differential input stages 206 and 212, respectively, may be generated externally and supplied to sense amplifier 202. Alternatively, these signals may be generated within the sense amplifier 202. For example, FIG. 2B depicts an exemplary signal generator circuit 250 which may be employed in sense amplifier 202 for generating control signals STROBE[0] and STROBE[1], in accordance with an illustrative embodiment of the invention. With reference to FIG. 2B, signal generator circuit 250 includes a resistor, R1, or alternative resistive element (e.g., MOS transistor), having a first terminal connecting to ground and having a second terminal connecting to VDD via a first fuse, F1, connected to resistor R1 at node CTL. Resistor R1 is preferably of relatively high resistance (e.g., greater than about 100 kilo ohms) so as to minimize the current dissipated in signal generator 250, although the invention is not limited to any specific resistance value for R1.

Signal generator circuit 250 further includes first and second AND gates, ND0 and ND1, respectively, which exhibit a logical AND function. A first input (A) of each of AND gates ND0 and ND1 is preferably operative to receive a strobe signal, STROBE, supplied to the signal generator circuit 250. A second input (B) of AND gate ND0 is adapted to receive the signal at node CTL, and a second input (B) of AND gate ND1 is adapted to receive a logical complement of the signal at node CTL. An output of AND gate ND0 is operative to generate the control signal STROBE[0] and an output of AND gate ND1 is operative to generate the control signal STROBE[1].

Under default conditions, fuse F1 is not blown, and therefore the signal at node CTL will be substantially equal to VDD (e.g. a logic high level). Therefore, the second input of AND gate ND0 will be at a logic high level and the second input of AND gate ND1 will be at a logic low level (being a logical complement of the signal at node CTL). Strobe signal STROBE is preferably a pulse which is normally a logic low level, and therefore control signals STROBE[0] and STROBE[1] will be normally at a logic low level. With signals STROBE[0] and STROBE[1] at a logic low level, both first and second switch circuits 210 and 214, respectively, will be turned off, thereby disabling first and second differential input stages 206 and 212, respectively. When activation of the sense amplifier 202 is required, such as, for example, during a read operation, the strobe signal STROBE pulses to a logic high level. When STROBE is a logic high level, control signal STROBE[0] will be at a logic high level and control signal STROBE[1] will remain at a logic low level.

When it is determined that the offset in first differential input stage 206 exceeds a prescribed threshold, fuse F1 may be open-circuited (e.g., by passing a large current through the fuse to melt metal forming the fuse, laser blowing, etc.). Resistor R1 serves as a pull-down device so that when fuse F1 is blown, the signal at node CTL will be pulled to a logic low level. Therefore, the second input of ND0 will be at a logic low level and the second input of ND1 will be at a logic high level. When the strobe signal STROBE is a logic high level, control signal STROBE[0] will remain at a logic low level and control signal STROBE[1] will be at a logic high level, thereby enabling second differential input stage 212.

Alternative signal generation circuitry is similarly contemplated for generating control signals STROBE[0] and STROBE[1], as will become apparent to those skilled in the art from the teachings set forth herein. For example, fuse F1 and resistor R1 in signal generator circuit 250 may be substituted by a register implementation for controlling the voltage at node CTL. In this manner, control signals STROBE[0] and STROBE[1] can be selectively programmed, for example either through an initialization routine or "on the fly," as a function of values stored in a register. Using this approach, the offset resulting from both first and second differential input stages may be individually tested to determine which input stage exhibits the lowest offset in the sense amplifier at any given time depending on varying conditions to which the sense amplifier is subjected.

Figure 3:
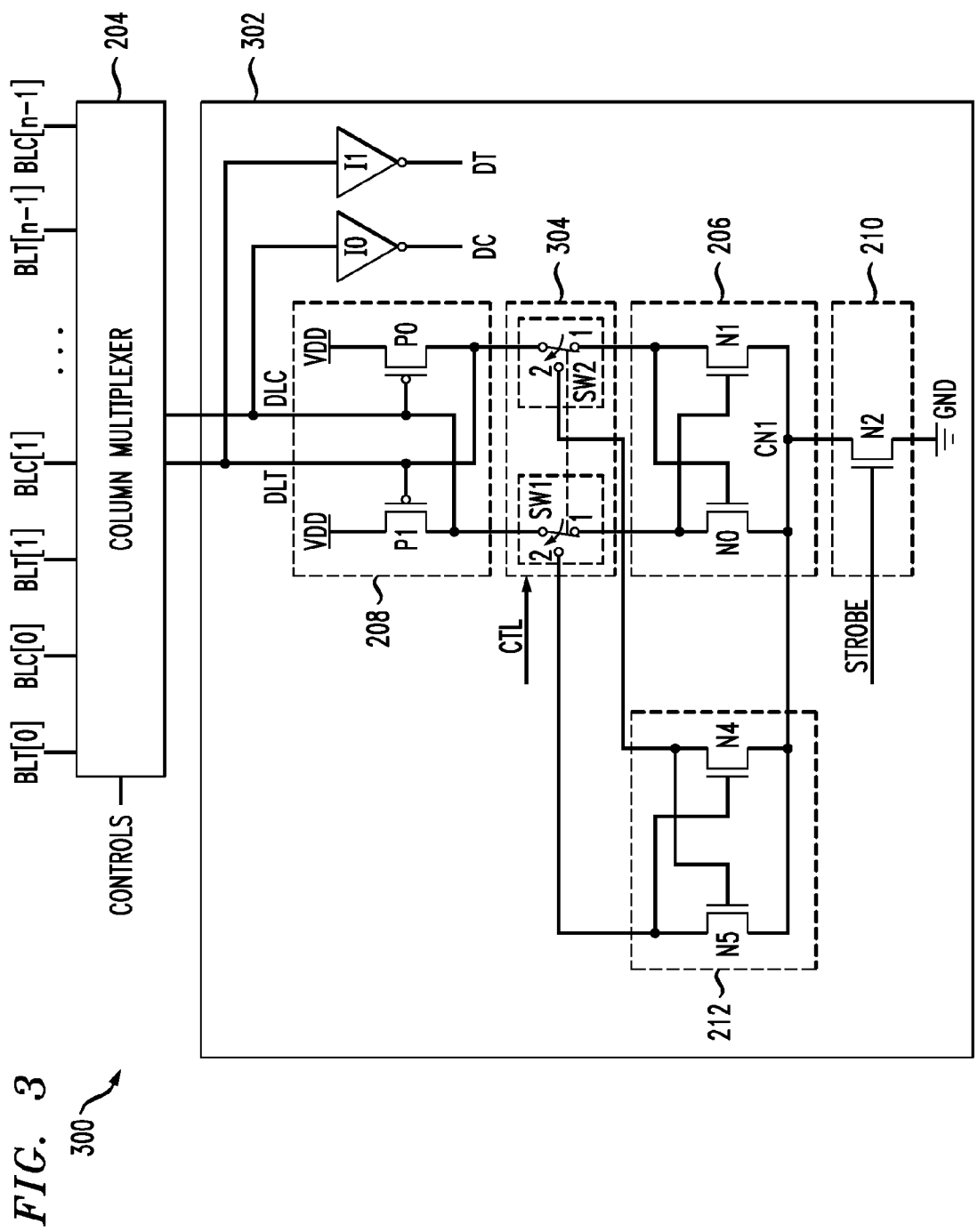
FIG. 3 is a schematic diagram depicting at least a portion of an exemplary memory circuit, formed in accordance with another embodiment of the present invention.

FIG. 3 is a schematic diagram depicting at least a portion of an exemplary memory circuit 300, formed in accordance with another embodiment of the invention. Memory circuit 300 includes a sense amplifier 302 coupled to a column multiplexer 204 via true and complement data lines, DLT and DLC, respectively. As apparent from the figure, sense amplifier 302 is similar to sense amplifier 202 shown in FIG. 2A, at least in that sense amplifier 302 includes first and second differential input stages 206 and 212, respectively, a load stage 208, and a switch circuit 210 connected to the first differential input stage for selectively enabling the first differential input stage, with the exception that sense amplifier 302 further includes a control circuit 304, or alternative control circuitry, connected to the first and second differential input stages. Second switch circuit 214 shown in FIG. 2A is also eliminated in sense amplifier 302 and first and second differential input stages 206, 212 are connected so as to share switch circuit 210 by connecting the sources of devices N4 and N5 in second differential input stage 212 to node CN1 in first differential input stage 206. First switch circuit 210 and control circuit 304 may be integrated together to form at least a portion of the same control circuitry.

Control circuit 304 is depicted conceptually as a pair of single-pole double-throw (SPDT) switches, SW1 and SW2, adapted to selectively connect either one of the first and second differential input stages 206 and 212, respectively, to true and complement data lines DLT, DLC. In practice, switches SW1 and SW2 may be implemented, for example, using transistor devices, a multiplexer, transmission gates, etc., as will become apparent to those skilled in the art in accordance with techniques set forth herein. Moreover, control circuit 304 may comprise other circuitry (not explicitly shown), for example circuitry to prevent the occurrence of floating nodes in the first and second differential input stages when either of the input stages is disconnected from the data lines.

In a first mode of operation, which may be represented as switch position 1, control circuit 304 is preferably adapted to connect first differential input stage 206 to data lines DLT and DLC and to disconnect second differential input stage 212 from the data lines as a function of at least one control signal, CTL, supplied to the control circuit. In a second mode of operation, which may be represented as switch position 2, control circuit 304 is preferably adapted to connect second differential input stage 212 to data lines DLT and DLC and to disconnect first differential input stage 206 from the data lines as a function of the control signal CTL. With control circuit 304 providing a means of selectively connecting the respective input stages 206, 212 to the data lines, the input stages may be connected directly to ground, thereby eliminating the need for first switch circuit 210.

In an illustrative testing methodology according to another aspect of the invention, a memory array incorporating techniques of the invention described herein may be independently tested using both the first and second differential input stages in the sense amplifier to obtain first and second data sets, respectively. The data set having the lowest VDD operating voltage is preferably chosen as being indicative of lowest DC offset voltage corresponding thereto. In accordance with another exemplary testing methodology, the memory array may be tested using the first differential input stage and, if the memory array fails to satisfy prescribed constraints under, for example, the low VDD operating point, then the memory array can be retested using the second differential input stage. If satisfactory test results are obtained using the second differential input stage, a fuse can be blown or a register set to configure the sense amplifier using the second differential input stage.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

An integrated circuit in accordance with the present invention can be employed in any application and/or electronic system which uses embedded memory or stand-alone memory. Suitable systems for implementing techniques of the invention may include, but are not limited, to personal computers, communication networks, electronic instruments (e.g., automated test equipment (ATE)), interface networks, etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A sense amplifier, comprising:
   a first sensing element;
   a second sensing element redundant to the first sensing element; and
   a switch circuit configured to switch between the first and second sensing elements when an offset of the sense amplifier is greater than a prescribed amount;
   wherein both of said sensing elements are configured to perform substantially the same function in the sense amplifier; and
   wherein in switching between the first and second sensing elements, the switch circuit replaces one of said sensing elements with the other of said sensing elements.

2. The sense amplifier of claim 1, wherein at least one of the first and second sensing elements comprises a differential input stage selectively connectable to differential input/output nodes of the sense amplifier and being adapted to receive a differential signal presented to the differential input/output nodes.

3. The sense amplifier of claim 1, wherein:
   the first sensing element comprises a first differential input stage selectively connectable to differential input/output nodes of the sense amplifier and being adapted to receive a differential signal presented to the differential input/output nodes;
   the second sensing element comprises a second differential input stage selectively connectable to the differential input/output nodes of the sense amplifier and being adapted to receive the differential signal presented to the differential input/output nodes, the second differential input stage being substantially matched and redundant to the first differential input stage; and
   the switch circuit comprises a control circuit connected to the first and second differential input stages, the control circuit being operative to selectively enable one of the first and second differential input stages as a function of at least one control signal supplied to the control circuit, the at least one control signal being a function of whether the offset of the sense amplifier is greater than the prescribed amount.

4. A sense amplifier, comprising:
   a first differential input stage selectively connectable to differential input/output nodes of the sense amplifier and being adapted to receive a differential signal presented to the differential input/output nodes;
   a second differential input stage selectively connectable to the differential input/output nodes of the sense amplifier and being adapted to receive the differential signal presented to the differential input/output nodes, the second differential input stage being substantially matched and redundant to the first differential input stage;
   a load stage operatively connected between a voltage supply of the sense amplifier and at least one of the first and second differential input stages, the load stage being operative to bias at least one of the first and second differential input stages at a prescribed operating point; and
   a control circuit connected to the first and second differential input stages, the control circuit being operative to selectively enable one of the first and second differential input stages as a function of at least one control signal supplied to the control circuit.

5. The sense amplifier of claim 4, wherein the control circuit is operative to connect one of the first and second differential input stages to the differential input/output nodes when a prescribed condition relating to the sense amplifier is detected.

6. The sense amplifier of claim 4, wherein the control circuit is operative to connect one of the first and second differential input stages to the differential input/output nodes when an offset of the sense amplifier is greater than a prescribed amount.

7. The sense amplifier of claim 4, further comprising a buffer circuit having inputs connected to the differential input/output nodes and generating a differential signal at an output thereof indicative of respective signals at the differential input/output nodes.

8. The sense amplifier of claim 4, wherein the load stage comprises first and second PMOS devices, a first source/drain of the first and second PMOS devices connecting to the voltage supply of the sense amplifier, a gate of the first PMOS device being connected to a first one of the differential input/output nodes, a second source/drain of the first and second PMOS devices being operatively connected to at least one of the first and second differential input stages, and a gate of the second PMOS device being connected to a second one of the differential input/output nodes.

9. The sense amplifier of claim 4, wherein each of the first and second differential input stages comprises first and second NMOS devices connected to one another in a cross-coupled configuration.

10. The sense amplifier of claim 9, wherein the first and second NMOS devices are substantially matched to one another.

11. The sense amplifier of claim 9, wherein in each of the first and second differential input stages, a first source/drain of the first and second NMOS devices is connectable to the differential input/output nodes, a second source/drain of the first and second NMOS devices is operatively connected to a voltage return of the sense amplifier, a gate of the first NMOS device is connected to the first source/drain of the second NMOS device, and a gate of the second NMOS device is connected to the second source/drain of the first NMOS device.

12. The sense amplifier of claim 4, wherein the control circuit comprises a switch circuit connected between the first and second differential input stages and the differential input/ output nodes, the control circuit being operative to selectively connect one of the first and second differential input stages to the differential input/output nodes as a function of the at least one control signal.

13. The sense amplifier of claim 12, wherein the control circuit is operable in one of at least first and second modes as a function of the at least one control signals, wherein in the first mode the control circuit is adapted to connect the first differential input stage to the differential input/output nodes and to disconnect the second differential input stage from the differential input/output nodes, and in the second mode the control circuit is adapted to connect the second differential input stage to the differential input/output nodes and to disconnect the first differential input stage from the differential input/output nodes.

14. The sense amplifier of claim 4, wherein the control circuit comprises:
 a first switch circuit operative to selectively enable the first differential input stage as a function of a first control signal; and
 a second switch circuit operative to selectively enable the second differential input stage as a function of a second control signal.

15. The sense amplifier of claim 14, wherein at least one of the first and second switch circuits comprises an NMOS device having a first source/drain connected to a corresponding one of the first and second differential input stages, a second source/drain connecting to a voltage return of the sense amplifier, and a gate for receiving a corresponding one of the first and second control signals.

16. The sense amplifier of claim 14, further comprising a control signal generator including:
 a resistive element having a first terminal connecting to a voltage return of the sense amplifier;
 a fuse having a first terminal connecting to the voltage supply of the sense amplifier and having a second terminal connected to a second terminal of the resistive element at a first node; and
 first and second logical AND gates, a first input of each of the AND gates being operative to receive a strobe signal, a second input of the first AND gate being operative to receive a signal indicative of a voltage level at the first node, a second input of the second AND gate being operative to receive a logical complement of the first signal at the first node, the first AND gate generating the first control signal and the second AND gate generating the second control signal.

17. The sense amplifier of claim 4, wherein the second differential input stage is redundant to the first differential input stage.

18. An integrated circuit including the sense amplifier of claim 1.

19. An electronic system, comprising:
 a memory array including a plurality of memory cells; and
 at least one sense amplifier connected to the memory array for selectively reading a logic state of at least one of the memory cells in the memory array, the at least one sense amplifier comprising:
  a first sensing element;
  a second sensing element redundant to the first sensing element; and
  a switch circuit configured to switch between the first and second sensing elements when an offset of the sense amplifier is greater than a prescribed amount
  wherein both of said sensing elements are configured to perform substantially the same function in the sense amplifier; and
  wherein in switching between the first and second sensing elements, the switch circuit replaces one of said sensing elements with the other of said sensing elements.

20. A method of reducing offset in a sense amplifier, the method comprising the steps of:
 providing a first sensing element in the sense amplifier;
 providing a second sensing element in the sense amplifier, the second sensing element being redundant to the first sensing element;
 determining an offset of the sense amplifier; and
 switching between the first and second sensing elements when an offset of the sense amplifier is greater than a prescribed amount
 wherein both of said sensing elements are configured to perform substantially the same function in the sense amplifier; and
 wherein in switching between the first and second sensing elements, one of said sensing elements is replaced with the other of said sensing elements.

* * * * *